United States Patent [19]
Mizumura et al.

[11] Patent Number: 5,334,259
[45] Date of Patent: Aug. 2, 1994

[54] AMORPHOUS SILICON SOLAR CELL AND METHOD OF MANUFACTURE

[75] Inventors: Takayuki Mizumura, Mihara; Kenji Sawada, Sumoto; Naoki Kojima, Sumoto; Yasuyoshi Kawanishi, Sumoto; Masatoshi Otsuki, Sumoto, all of Japan

[73] Assignee: Sanyo Electric Co., Ltd., Osaka, Japan

[21] Appl. No.: 942,830

[22] Filed: Sep. 10, 1992

[30] Foreign Application Priority Data

| Sep. 10, 1991 | [JP] | Japan | 3-230183 |
| Oct. 22, 1991 | [JP] | Japan | 3-274146 |
| Nov. 28, 1991 | [JP] | Japan | 3-314729 |

[51] Int. Cl.⁵ .................. H01L 31/04; H01L 31/18
[52] U.S. Cl. .................. 136/258; 136/244; 136/256; 437/4
[58] Field of Search .................. 437/4, 51, 189, 192, 437/205, 228; 136/256, 258 AM, 244

[56] References Cited

U.S. PATENT DOCUMENTS

| 4,758,526 | 7/1988 | Thalheimer | 437/2 |
| 4,795,500 | 1/1989 | Kishi et al. | 136/244 |
| 4,872,925 | 10/1989 | McMaster | 136/244 |

FOREIGN PATENT DOCUMENTS

| 60-240170 | 11/1985 | Japan | 136/259 |
| 60-253266 | 12/1985 | Japan | 136/244 |
| 2-307278 | 12/1990 | Japan | 136/244 |

*Primary Examiner*—Aaron Weisstuch
*Attorney, Agent, or Firm*—Wenderoth, Lind & Ponack

[57] ABSTRACT

A method of amorphous silicon solar cell manufacture comprises forming thin films of transparent electrode, amorphous silicon, and backside electrode, in that order, on a transparent substrate. An alkali resistant metal is used For the backside electrode. The backside electrode and the amorphous silicon layer are wet-etched, thereby opening holes or grooves that penetrate through these layers.

19 Claims, 2 Drawing Sheets

AMORPHOUS SILICON SOLAR CELL AND METHOD OF MANUFACTURE

BACKGROUND OF THE INVENTION

This invention relates to an amorphous silicon solar cell and a method of its manufacture, and in particular to a method of manufacture of a see-through type amorphous silicon solar cell or an integrated type amorphous silicon solar cell, An amorphous silicon solar cell is fabricated by forming thin layers of a transparent electrode, amorphous silicon, and backside electrode on a substrate. Vacuum evaporated aluminum with a film thickness of of 0.3 to 1 μm is principally used for the backside electrode. A single cell of this type of solar cell has a voltage of 1 Volt or less. A plurality of cells can be connected in series to attain a prescribed voltage. The integrated type solar cell has been developed for connecting a plurality of cells in series. In this type of solar cell, a patterning process is used to pattern the transparent electrode, amorphous silicon (subsequently referred to as a-Si) layer, and backside electrode A see-through type solar cell, provided with grooves and perforations, that passes part of the incident light has been developed. The method of manufacturing the see-through type solar cell includes forming thin layers of transparent electrode film, photovoltaic layer, and metallic layer backside electrode on a transparent substrate. Next, resist with a pattern of openings is formed on the metallic electrode layer, and holes and grooves are etched through the metallic electrode layer and then through the photovoltaic layer.

In this method, when the metallic layer backside electrode is etched, it is done by 'wet-etching' using an etching solution. However, when the photovoltaic layer is etched, it is done by 'dry-etching' normally using a plasma discharge of $CF_4$ gas.

However, in the fabrication method described above, after wet-etching the metallic electrode layer, the photovoltaic layer must be dry-etched. Therefore, the extremely troublesome operation of reloading substrates, from the cassette used for wet-etching the metallic electrode layer, into the tray used for dry-etching, must be performed. Further, since moisture remaining on the substrate after wet-etching must be sufficiently removed before insertion into the dry-etching apparatus, a long drying time is required. Still further, the vacuum system dry-etching apparatus is extremely expensive and is only capable of a limited through-put.

The first primary object of the present invention is to solve the above mentioned problems and provide an inexpensive method of manufacturing large quantities of amorphous silicon solar cells.

Unfortunately, an amorphous silicon solar cell with an aluminum backside electrode cannot be patterned by wet-etching. The reason for this is that an aluminum backside electrode is etched away by NaOH or other alkaline solutions used to etch the a-Si layer. This drawback is avoided by using an alkali resistant metal for the backside electrode. Cu (copper) and Ag (silver) are alkali resistant metals. Metals such as Cu and Ag have high light reflectivity, and reflect light that penetrates through the a-Si layer to improve the solar cell's $I_{sc}$ (short circuit current) and $P_{max}$ (maximum power output). However, these metals have the drawback that they do not strongly bond with the a-Si layer and have not been of practical use in the manufacturing environment.

The second primary object of the present invention is to provide an inexpensive, efficient method of mass producing amorphous silicon solar cells in which the backside electrode is strongly bonded to the a-Si layer.

SUMMARY OF THE INVENTION

The method of amorphous silicon solar cell manufacture of this invention comprises forming thin layers of transparent electrode, amorphous silicon, and backside electrode, in that order, on a transparent substrate. An alkali resistant metal is used for the backside electrode. The backside electrode and the amorphous silicon layer are wet-etched thereby opening holes and grooves that penetrate through these layers.

Further, in a preferred embodiment of the method of amorphous silicon solar cell manufacture of this invention, the backside electrode is attached to the a-Si layer via a metallic thin film attachment layer formed between the a-Si layer and the backside electrode. After forming the amorphous silicon layer, the metallic thin film attachment layer, and the backside electrode in consecutive layers, the backside electrode, the metallic thin film attachment layer, and the amorphous silicon layer are wet-etched, thereby providing holes and grooves that penetrate through these layers.

DETAILED DESCRIPTION OF THE INVENTION

As described above, since both the backside electrode and amorphous silicon layer are wet-etched in the method of amorphous silicon solar cell manufacture of the present invention, the a-Si layer can be etched sequentially after etching the backside electrode without the necessity of moisture removal or drying. Consequently, a sequential etching process can be performed which improves manufacturability. By using an alkali resistant metal for the backside electrode, the problem of further etching the backside electrode when the a-Si layer is etched with alkaline solution is solved.

Further, the method of amorphous silicon solar cell manufacture of the present invention forms the backside electrode layer on top of the a-Si layer via a metallic thin film attachment layer. Consequently, there are no special bonding characteristics required for the backside electrode with respect to the a-Si layer. Therefore, although metals such as Ag and Cu with excellent light reflection properties cannot be attached to the a-Si layer, they can be used as backside electrode materials. Furthermore, since the metallic thin film attachment layer providing bonding between the backside electrode and the a-Si layer is a thin layer, it has a high degree of transparency, and $I_{sc}$ (short circuit current) and $P_{max}$ (maximum power output) are improved by efficient light reflection by the backside electrode.

The following describes in detail embodiments of the present invention based on illustrations.

Embodiment No. 1

Figure 1:
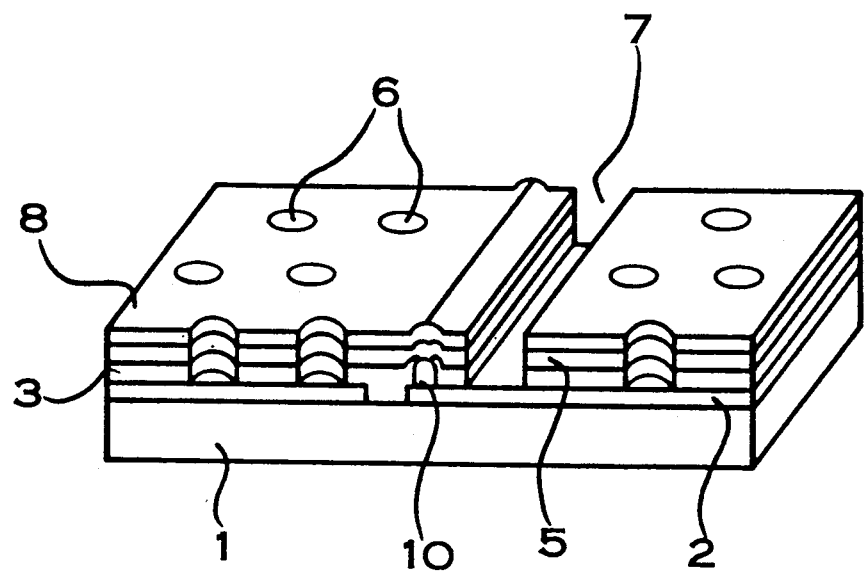
FIG. 1 is a cross-sectional view showing an amorphous silicon solar cell fabricated by the method of manufacture of the present invention.

Turning to FIG. 1, the see-through type amorphous silicon solar cell shown is a laminate of thin layers of a transparent electrode 2, an amorphous silicon (a-Si) layer 3, and a backside electrode 5, on a transparent substrate 1 such as a glass plate. This solar cell is fabricated in the following manner:

(1) A transparent electrode 2 such as indium tin oxide (ITO) or $SnO_2$ is formed on the surface of the transparent substrate 1 by a spray method, chemical vapor deposition (CVD), evaporation, ion plating, sputtering, or other film growth method.

(2) Ag paste 10 is then printed on the transparent electrode 2 at prescribed locations.

(3) The a-Si layer 3 is then formed over the entire surface.

(4) The backside electrode 5 is then formed over the entire surface of the a-Si layer 3. Metals such as Cu, nickel (Ni), or NiCu alloy are used for the backside electrode 5. The thickness of the backside electrode 5 film is approximately 1500 Angstroms.

(5) The backside electrode 5 is then connected to the Ag paste 10 region by laser welding.

(6) Next, a resist layer 8 is applied and patterned. As shown in FIG. 1, the resist layer 8 allows numerous holes 6 and grooves 7 to be formed in the backside electrode 5 and a-Si layer 3 to make a see-through solar cell that passes part of the incident light.

(7) $FeCl_3$ solution is then used to wet-etch part of the backside electrode 5.

(8) $HF \cdot HNO_3$ is used to pre-treat the exposed surfaces of the a-Si layer 3.

(9) An alkaline solution such as NaOH is used to wet-etch the a-Si layer 3.

(10) Follow up etching of the backside electrode 5 is performed with $FeCl_3$ solution.

A cross-section of the see-through openings of an amorphous silicon solar cell obtained by the above process is shown in FIG. 1. Process step (8) above, in which the surface of the a-Si layer 3 is treated with $HF \cdot HNO_3$ solution, is to insure that etching with NaOH solution in the next step, (9), will occur. Specifically, if the a-Si layer surface is not pre-treated with $HF \cdot HNO_3$, an oxide film may form on the surface of the a-Si layer 3 preventing etching with NaOH.

At this point one might consider using the same pre-treatment $HF \cdot HNO_3$ solution to etch the a-Si layer 3. However, since the concentration of the $HF \cdot HNO_3$ solution used for pre-treatment is only several percent, complete etching of the a-Si layer 3 with this same $HF \cdot HNO_3$ would require a long etching time due to the low concentration of the solution. On the other hand, if a-Si layer 3 etching is done with $HF \cdot HNO_3$ concentrated to tens of percent, etching time is shortened, but the deleterious effect of glass substrate etching occurs because of the use of concentrated $HF \cdot HNO_3$ solution. Therefore, $HF \cdot HNO_3$ cannot be used for etching the a-Si layer 3.

Although the surface of the a-Si layer 3 is treated with $HF \cdot HNO_3$ in the fabrication method above, HF, $HBF_4$, or other aqueous solutions of fluoride compounds have a similar effect.

Ag, titanium(Ti), or chromium(Cr) can be used for the backside electrode 5.

Embodiment No. 2

Other than the following steps, the see-through type amorphous silicon solar cell of this embodiment is fabricated in the same manner as Embodiment No. 1: (1) instead of using Cu, Ni, or Ni-Cu alloy for the backside electrode 5, a three layer Ti/Cu/Ti (titanium/copper/titanium) backside electrode is used; (2) before process step (7) in Embodiment No. 1, the Ti surface of the backside electrode is etched with $HF \cdot HNO_3$: and (3) in step (8), the Ti layer between the a-Si layer and Cu layer is etched with $HF \cdot HNO_3$ while pre-treating the surface of the a-Si layer 3.

The film thicknesses of the Ti/Cu/Ti (bottom to top) are approximately 30, 1000, and 500 Angstroms, respectively. The 30 Angstroms Ti layer improves attachment strength between the Cu and a-Si layers. The 500 Angstroms Ti layer protects the Cu layer from being corroded and helps improve its durability.

Embodiment No. 3

Other than the following steps, the see-through type amorphous silicon solar cell of this embodiment is fabricated in the same manner as Embodiment No. 1: (1) instead of using Cu, Ni, or Ni-Cu alloy for the backside electrode 5, a three layer Ti/Cu/Ni backside electrode is used; and (2) in process step (8) of Embodiment No. 1, the Ti layer between the a-Si layer and Cu layer is etched with $HF \cdot HNO_3$ while pre-treating the surface of the a-Si layer 3.

The film thicknesses of the Ti/Cu/Ni (bottom to top) are approximately 30, 1000, and 500 Angstroms, respectively.

Embodiment No. 4

Other than the following step, the see-through type amorphous silicon solar cell of this embodiment is fabricated in the same manner as Embodiment No. 3: (1) 500 Angstroms of CuNi is used in place of Ni in the backside electrode.

In the above Embodiments No. 2, 3, and 4, as well as Embodiment No. 1, the see-through type amorphous silicon solar cell is fabricated entirely with wet-etching process steps, and thus, can be mass produced with inexpensive processing apparatus.

In the see-through type amorphous silicon solar cell manufacturing methods above, holes and grooves are provided by wet-etching the backside electrode and a-Si layer. These manufacturing methods do not require expensive vacuum systems needed by prior-art manufacturing methods. Compared with prior-art dry-etching, which requires moisture removal and drying after wet-etching, wet-etching-only methods can fabricate see-through type amorphous silicon solar cells improving process step continuity and manufacturability.

Embodiment No. 5

Figure 2:
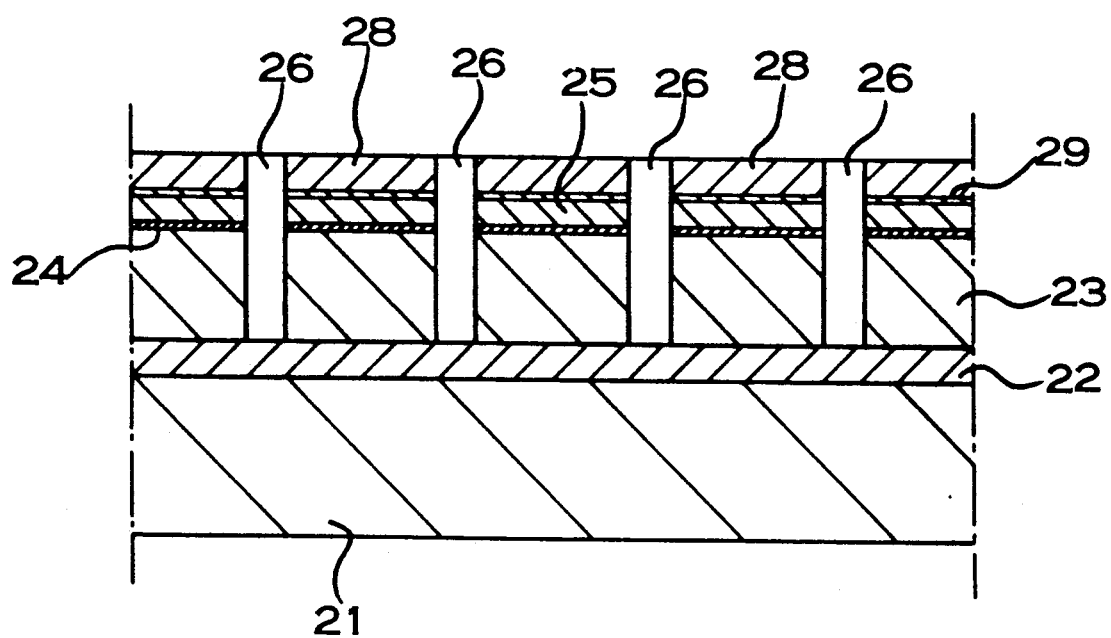
FIG. 2 is a cross-sectional view showing one embodiment of a see-through type amorphous silicon solar cell fabricated by the method of manufacture of the present invention.

Turning to FIG. 2, the see-through type amorphous silicon solar cell shown is a laminate of thin layers of a transparent electrode 22, an amorphous silicon (a-Si) layer 23, a metallic thin film attachment layer 24, and a backside electrode 25, on a transparent substrate 21 such as a glass plate. This solar cell is fabricated in the following manner. (1) A transparent electrode 22 such as indium tin oxide (ITO) or SnO2 is formed on the surface of the transparent substrate 21 by the same methods listed in Embodiment No. 1.

(2) The a-Si layer 23, metallic thin film attachment layer 24, and backside electrode 25 are formed on the transparent electrode 22.

The metallic thin film attachment layer 24 and backside electrode 25 are formed by sputtering. The metallic thin film attachment layer 24 is a 12 Angstroms thick W (tungsten) or Cr (chromium) film. The backside electrode 25 is a 2000 Angstroms Cu layer. A 2000 Angstroms Ti layer 29 is provided on the surface of the backside electrode 25. This Ti layer protects the Cu backside electrode 25 from being corroded and improves its durability.

(3) Next, a resist layer 28 is applied and patterned as required. As shown in FIG. 2, the resist layer 28 allows numerous holes 26 to be formed in the backside electrode 25, the metallic thin film attachment layer 24, and the a-Si layer 23 to make a see-through type solar cell that passes part of the incident light.

(4) HF·HNO3 is used to wet-etch and remove part of the Ti layer 29.

(5) FeCl3 solution is used to wet-etch and remove part of the Cu backside electrode 25.

(6) An aqueous mixture of K3Fe(CN)6 and NaOH solution is used to wet-etch the W or Cr metallic thin film attachment layer 24.

(7) An alkaline solution such as NaOH is used to wet-etch the a-Si layer 23.

Results of electrical measurements of prototype solar cells fabricated by the above process are shown in Table 1.

The separation test In Table 1 was measured on separately fabricated solar cells. For these solar cells, a transparent electrode layer was formed on the transparent substrate surface, and a 1 cm square a-Si layer, metallic thin film attachment layer, and backside electrode were formed on the surface of the transparent electrode layer. Solar cells fabricated by process steps (1) and (2) prior to hole etching were used for this separation test.

The reason for using solar cells without hole openings for the separation test was because there is almost no loss of attachment strength of the backside electrode due to the holes. In the separation test, cellophane tape was attached to the surface of the 1 cm square backside electrode, then peeled off, measuring whether the backside electrode separated or not.

Further, to clarify how much better characteristics are obtained by Embodiment No. 5 solar cells compared with prior-art devices, solar cells with a sputtered Cu backside electrode on the a-Si layer with no metallic thin film attachment layer were also made for comparison in this table. Solar cells with a backside electrode layered on the a-Si layer by thermal evaporation from a W boat were also fabricated for comparison.

TABLE 1

|  | SEPARATION RATIO | Voc [V] | Isc [mA/cm$^2$] | FF | Pmax [mW/cm$^2$] |
|---|---|---|---|---|---|
| Cu (2000Å SPUTTERED) | 98/98(=100%) | 0.83(0.98) | 14.26(1.02) | 0.65(1.02) | 7.64(1.02) |
| W (12Å SPUTTERED)/Cu (2000Å SPUTTERED) | 2/98(=2%) | 0.86(1.01) | 14.36(1.03) | 0.62(0.97) | 7.70(1.02) |
| Al (THERMAL EVAPORATION)/(2000Å) | 0/98(=0%) | 0.85 | 13.93 | 0.64 | 7.52 |

Ratio compared with THERMAL EVAPORATION in parentheses, ( ).
Light source: AM-1.5 100 mW/cm$^2$ As shown in this table, even though Cu is used for the backside electrode, amorphous silicon solar cells produced by Embodiment No. 5 have drastically reduced separation of the backside electrode from the a-Si layer, and exhibit $I_{sc}$ and $P_{max}$ values similar to prior-art devices with no metallic thin film attachment layer.

Embodiment No. 6

Other than the W or Cr metallic thin film attachment layer 24 being replaced by a Ti metallic thin film attachment layer 24 thickness of 12–300 Angstroms, and etching of the metallic thin film attachment layer 24 done with HF·HNO3, the see-through type amorphous silicon solar cell of this embodiment is fabricated in the same manner as Embodiment No. 5. Characteristics of prototype solar cells made by this method are shown in Table 2.

TABLE 2

|  | SEPARATION RATIO | Voc [V] | Isc [mA/cm$^2$] | FF | Pmax [mW/cm$^2$] |
|---|---|---|---|---|---|
| Cu (2000Å SPUTTERED) | 36/36(=100%) | 0.87(1.00) | 13.40(1.09) | 0.67(1.00) | 7.85(1.08) |
| Ti (12Å SPUTTERED)/Cu (2000Å SPUTTERED) | 0/36(=0%) | 0.85(0.98) | 12.83(1.05) | 0.67(1.00) | 7.29(1.00) |
| Ti (18Å SPUTTERED)/Cu (2000Å SPUTTERED) | 0/36 | 0.86(0.99) | 12.59(1.03) | 0.67(1.00) | 7.22(1.00) |
| Ti (21Å SPUTTERED)/Cu (2000Å SPUTTERED) | 0/36 | 0.87(1.00) | 12.46(1.02) | 0.68(1.02) | 7.38(1.02) |
| Ti (27Å SPUTTERED)/Cu (2000Å SPUTTERED) | 0/36 | 0.86(0.99) | 12.58(1.03) | 0.67(1.00) | 7.31(1.01) |
| Ti (60Å SPUTTERED)/Cu (2000Å SPUTTERED) | 0/36 | 0.85(0.98) | 12.56(1.03) | 0.67(1.00) | 7.13(0.98) |
| Ti (39Å SPUTTERED)/Cu (2000Å SPUTTERED) | 0/36 | 0.85(0.98) | 12.51(1.02) | 0.68(1.02) | 7.19(0.99) |
| Ti (51Å SPUTTERED)/Cu (2000Å SPUTTERED) | 0/36 | 0.86(0.99) | 12.60(1.03) | 0.66(0.99) | 7.11(0.98) |
| Ti (60Å SPUTTERED)/Cu (2000Å SPUTTERED) | 0/36 | 0.85(0.98) | 12.28(1.00) | 0.67(1.00) | 7.06(0.98) |
| Ti (100Å SPUTTERED)/Cu (2000Å SPUTTERED) | 0/36 | 0.85(0.98) | 11.89(0.97) | 0.67(1.00) | 6.88(0.95) |
| Ti (200Å SPUTTERED)/Cu (2000Å SPUTTERED) | 0/36 | 0.87(1.00) | 11.73(0.96) | 0.67(1.00) | 6.85(0.95) |
| Ti (300Å SPUTTERED)/Cu (2000Å SPUTTERED) | 0/36 | 0.87(1.00) | 11.58(0.96) | 0.68(1.02) | 6.79(0.91) |
| Al (THERMAL EVAPORATION)/(2000Å) | 0/36 | 0.87 | 12.25 | 0.67 | 7.24 |

Ratio compared with THERMAL EVAPORATION in parentheses, ( ).
Light source: AM-1.5 100 mW/cm$^2$ As shown in Table 2, solar cells fabricated by the method of Embodiment No. 6 show no backside electrode separation and excellent $I_{sc}$ and $P_{max}$ characteristics similar to prior-art devices with no metallic thin film attachment layer.

Embodiment No. 7

Figure 3:
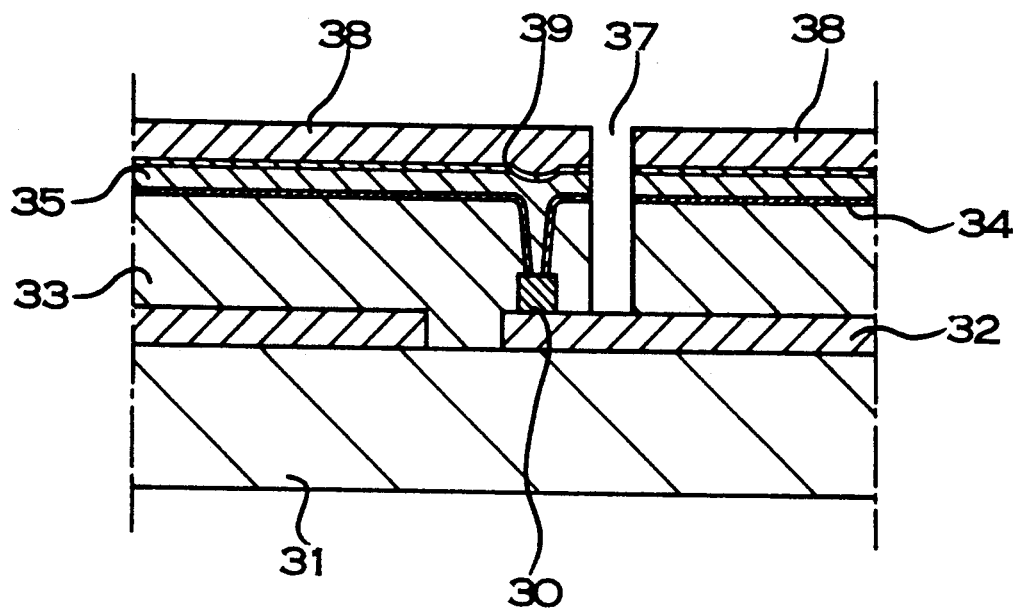
FIG. 3 is a cross-sectional view showing one embodiment of an integrated type amorphous silicon solar cell fabricated by the method of manufacture of the present invention.

Turning to FIG. 3, an integrated type solar cell is shown. This solar cell is fabricated by the following process.

(1) A transparent electrode 32 is formed and patterned on the surface of a glass transparent substrate 31.

(2) Ag paste 30 is printed on the transparent electrode 32 at prescribed locations.

(3) An a-Si layer 33 is formed over the entire surface.

(4) A backside electrode 35 is formed over the entire surface of the a-Si layer 33 via a metallic thin film attachment layer 34.

Ti or W are used for the metallic thin film attachment layer 34. Ag is used for the backside electrode 35. A Ti layer 39 is formed on the surface of the backside electrode 35.

(5) The backside electrode 35 is connected to the Ag paste 30 regions by laser welding.

(6) Next, a thermosetting resin resist layer 38 is applied and given a prescribed patterning. As shown in FIG. 3, the resist layer 38 is for the purpose of establishing grooves 37 in the backside electrode 35, the metallic thin film attachment layer 34, and the a-Si layer 33 to make an integrated type solar cell.

(7) HF·HNO$_3$ is used to etch the Ti layer 39.

(8) HNO$_3$ is used to wet-etch the Ag backside electrode 35.

(9) The metallic thin film attachment layer 34 is wet-etched. An aqueous mixture of K$_3$Fe(CN)$_6$ and NaOH solution is used to etch a W metallic thin film attachment layer 34, and HF·HNO$_3$ is used to etch a Ti metallic thin film attachment layer 34.

Characteristics of integrated type solar cells fabricated by this method are shown in Table 3. In this table, the separation test was measured in the same manner as for Embodiment No. 5. Specifically, the separation test was performed using specially fabricated solar cells. These solar cells were made by forming a 1 cm square a-Si layer, metallic thin film attachment layer, and backside electrode on the surface of the transparent electrode layer attached to the transparent substrate surface. Solar cells without etched trenches were used. Further, V$_{oc}$ and P$_{max}$ in Table 3 are the computed one-cell equivalent values.

see-through type amorphous silicon solar cell is a laminate of thin layers of a transparent electrode 42, an a-Si layer 43, a metallic thin film attachment layer 44, and a backside electrode 45, on a transparent substrate 41 such as a glass plate. This solar cell is fabricated in the following manner.

(1) A transparent electrode 42 is patterned on the surface of a glass transparent substrate 41.

(2) Ag paste 40 is printed on the transparent electrode 42 at prescribed locations.

(3) An a-Si layer 43 is formed over the entire surface.

(4) A backside electrode 45 is formed over the entire surface of the a-Si layer 43 via a metallic thin film attachment layer 44. The metallic thin film attachment layer 44 is a 30 Angstroms thick Ti film. The backside electrode 45 is a 1000 Angstroms Cu layer. A 500 Angstroms Ti layer 49 is provided on the surface of the backside electrode 45.

This Ti layer protects the Cu backside electrode 45 from being corroded and contributes to improved durability.

(5) The backside electrode 45 is connected to the Ag paste 40 regions by laser welding.

Figure 4:
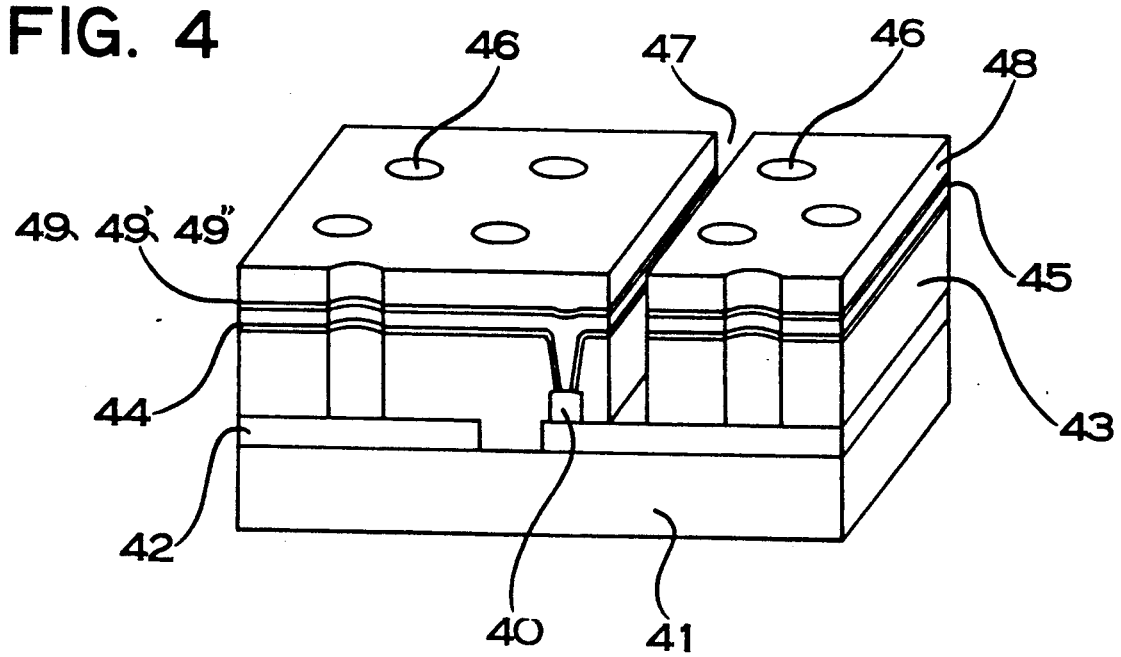
FIG. 4 is a cross-sectional view showing another embodiment of a see-through type amorphous silicon solar cell fabricated by the method of manufacture of the present invention.

(6) Next, a thermosetting resin resist layer 48 is applied and given a prescribed patterning. As shown in FIG. 4, the resist layer 48 is for the purpose of establishing holes 46 and grooves 47 in the backside electrode 45, the metallic thin film attachment layer 44, and the a-Si layer 43 to make an integrated, see-through type solar cell.

(7) HF·HNO$_3$ is used to etch the Ti layer 49.

(8) FeCl$_3$ solution is used to wet-etch the Cu backside electrode 45.

(9) HF·HNO$_3$ is used to etch the Ti metallic thin film attachment layer 44 and treat the surface of the a-Si layer 43.

(10) An alkaline solution such as NaOH is used to wet-etch the a-Si layer 43.

(11) FeCl$_3$ solution is used for follow up etching of the Cu backside electrode 45.

Until step (11) is performed, undercut at the a-Si-backside electrode interface occurs, and the backside electrode 45 is exposed by etching of the a-Si layer 43. Here the follow-up etch takes off the exposed regions of backside electrode 45, and thereby keeps the backside

TABLE 3

|  | SEPARATION RATIO | Voc [V] | Isc [mA/cm$^2$] | FF | Pmax [mW/cm$^2$] |
|---|---|---|---|---|---|
| Ti (22Å SPUTTERED)/ Ag (2000Å SPUTTERED) | 53/98(=54%) | 0.83(1.00) | 13.98(1.08) | 0.69(1.00) | 7.95(1.07) |
| W (12Å SPUTTERED)/ Ag (2000Å SPUTTERED) | 27/98(=28%) | 0.84(1.01) | 13.76(1.06) | 0.69(1.00) | 8.00(1.08) |
| Ag (2000Å SPUTTERED) | 98/98(=100%) | 0.83(1.00) | 14.10(1.09) | 0.69(1.00) | 8.09(1.09) |
| Al (THERMAL EVAPORATION)/ (2000Å) | 0/98(=0%) | 0.83 | 12.94 | 0.69 | 7.42 |

Ratio compared with THERMAL EVAPORATION in parentheses, ( ).
Light source: AM-1.5 100 mW/cm$^2$ As shown in this table, an amorphous silicon solar dell using an Ag backside electrode having reduced separation from the a-Si layer can be fabricated by Embodiment No. 7. In particular, devices with a W metallic thin film attachment layer have separation characteristics superior than those with a Ti metallic thin film attachment layer. Further, excellent I$_{sc}$ and P$_{max}$ characteristics are also shown by solar cells made by this method.

Embodiment No. 8

Turning to FIG. 4, another embodiment of the present invention is shown. As shown in this figure, the electrode 45 from touching and shorting out with the transparent electrode 42.

FIG. 4 shows a cross-section of hole and groove regions of the amorphous silicon solar cell obtained by this process. Process step (9) above, in which the surface of the a-Si layer 43 is treated with HF·HNO$_3$ solution, is to insure that etching with NaOH solution in the next step, (10), will occur. Specifically, if the a-Si layer surface is not pre-treated with HF·HNO$_3$, an oxide film may form on the surface of the a-Si layer 43, preventing etching with NaOH.

Experiment No. 1

An HF·HNO$_3$ pre-treatment is described below. Sample preparation was as follows.

(1) A transparent electrode was formed and patterned on the surface of a glass transparent substrate.

(2) An a-Si layer was formed over the entire surface. The a-Si layer thickness was 3500 Angstroms.

(3) A backside electrode was layered over the entire a-Si surface. The backside electrode was 1000 Angstroms of Cu.

Two different sample substrates were produced by the above method. After etching the Cu backside electrode with FeCl$_3$ solution and prior to etching the a-Si layer with NaOH solution under the same etching conditions, the a-Si surface of sample A was pre-treated with HF·HNO$_3$ solution while that of sample B was not.

Sample A and B film thicknesses were measured in several locations and the results displayed in Table 4.

TABLE 4

|  | AMORPHOUS SILICON LAYER THICKNESS (Å) |
|---|---|
| SAMPLE A | 150 |
| SAMPLE B | 300–2400 |

As shown in Table 4, consistent thicknesses were measured at all locations for sample A with HF·HNO$_3$ pre-treatment, indicating uniform etching of the a-Si layer. However, for sample B with no pre-treatment, a large variation in thickness measurements over the range from 300 to 2800 Angstroms results. It is therefore concluded that etching is nonuniform for the case of sample B.

From the above result, it is clear that the a-Si layer can be uniformly etched with little variation after surface pre-treatment with HF·HNO$_3$.

As mentioned before, one might consider using the same pre-treatment HF·HNO$_3$ solution to etch the a-Si layer. However, since the concentration of the HF·HNO$_3$ solution used for pre-treatment is only several percent, complete etching of the a-Si layer with this same HF·HNO$_3$ would require a long etching time due to the low concentration of the solution. On the other hand, if a-Si layer etching is done with HF·HNO$_3$ concentrated to tens of percent, etching time is shortened, but the deleterious effect of glass substrate etching occurs because of the use of concentrated HF·HNO$_3$ solution. Therefore, HF·HNO$_3$ cannot be used for etching the a-Si layer.

Although the surface of the a-Si layer is treated with HF·HNO$_3$ in Embodiment No. 8, HF, HBF$_4$, or other aqueous solutions of fluoride compounds have a similar effect.

Embodiment No. 9

Other than the following steps, the amorphous silicon solar cell of this embodiment is fabricated in the same manner as Embodiment No. 8: in step (4) a 500 Angstroms thick Ni layer 49' is formed on the surface of the backside electrode 45; and in step (11) FeCl$_3$ solution is used for follow up etching of the Cu backside electrode 45 and the Ni layer 49' on its surface.

Embodiment No. 10

Other than the following steps, the amorphous silicon solar cell of this embodiment is fabricated in the same manner as Embodiment No. 8: in step (4) a 500 Angstroms thick NiCu layer 49" is formed on the surface of the backside electrode 45; and in step (11) FeCl$_3$ solution is used for follow up etching of the Cu backside electrode 45 and the NiCu layer 49" on its surface.

In Embodiment No. 8, even though three layers are formed, the Ti metallic thin film attachment layer 44, the Cu backside electrode 45, and the Ti layer 49 on the surface of the backside electrode 45, in the case of sputtering, the use of common materials means only two (Ti and Cu) sputter targets must be used, and fabrication can be accomplished inexpensively.

In Embodiment No. 9, when follow up etching of the Cu backside electrode 45 and the Ni layer 49' on its surface is performed, both layers can be etched with FeCl$_3$ solution. Therefore, any Ni layer 49' remaining on the Cu backside electrode 45 in an overhang fashion, can be etched, and chances of short circuit defects from the Ni layer 49' touching the transparent electrode 42 can be drastically reduced.

In Embodiment No. 10, a NiCu layer 49" is formed on the surface of the backside electrode. When forming a ferromagnetic film by sputtering, a strong magnet is required, so the apparatus is expensive. Further, the target utilization efficiency of Ferromagnetic targets is poor compared with non-ferromagnetic targets. To eliminate these drawbacks, the non-ferromagnetic NiCu alloy was used for film formation in Embodiment No. 10. Since this NiCu alloy is also etched by FeCl$_3$ solution, it can be etched simultaneously with the backside electrode 45 using time same etch solution.

Considering durability against corrosion, the composition of Ni and Cu in the NiCu alloy is preferably higher percent of Ni, but until the alloy's magnetic transformation, any composition of Ni and Cu results in the same effect from Embodiment No. 10.

In the amorphous silicon solar cells of Embodiment Nos. 5–10, the backside electrode is attached to the a-Si layer via a metallic thin film attachment layer. In these embodiments, metals which have strong bonding properties to both the a-Si layer and the backside electrode are used for the metallic thin film attachment layer. In addition, alkali resistant metals are used for the metallic thin film attachment layer and the backside electrode. Etch holes and grooves are established through this a-Si layer, metallic thin film attachment layer, and backside electrode laminate by wet-etching. Consequently, either see-through or integrated type amorphous silicon solar cells can be efficiently and inexpensively fabricated in quantity by these processes using wet-etching. The reason etch holes and grooves can be processed efficiently and inexpensively by wet-etching is that alkali resistant metals are used for the metallic thin film attachment layer and the backside electrode, thereby preventing exposed edges of the metallic thin film attachment layer and the backside electrode from being etched by the a-Si layer etching solution.

Further, by pre-treatment of the a-Si layer surface using HF·HNO$_3$, the subsequent a-Si layer etch can be accomplished smoothly with NaOH solution. This eliminates nonuniformity in a-Si etching.

Still further, in addition to other properties of amorphous silicon solar cells fabricated by the above methods, metals such as Ag and Cu with excellent light reflectivity can be solidly attached to the a-Si layer and used as the backside electrode. Also, the metallic thin film attachment layer between the a-Si layer and the backside electrode can be made extremely thin to drastically reduce light absorption by this film. Therefore, since light penetrating through the a-Si layer can be effectively reflected by the backside electrode, incident light is directed to the a-Si layer in a highly efficient manner, improving the critical solar cell parameters $I_{sc}$ and $P_{max}$.

In other words, despite the fact that amorphous silicon solar cells can be produced in quantity, simply, efficiently, and inexpensively by the above methods, excellent electrical characteristics are also obtained.

We claim:

1. A method of amorphous silicon solar cell manufacture comprising forming thin layers of:
   (a) transparent electrode;
   (b) amorphous silicon; and
   (c) backside electrode;
   in that order, on a transparent substrate; and characterized in that:
   (d) an alkali resistant metal is used for said backside electrode; and
   (e) said backside electrode is wet-etched using a first etchant and said amorphous silicon layer is wet-etched with a second, alkaline etchant solution, thereby opening holes or grooves that penetrate through these layers.

2. A method of amorphous silicon solar cell manufacture as recited in claim 1 wherein copper (Cu), nickel (Ni), or NiCu alloy is used for the backside electrode.

3. A method of amorphous silicon solar cell manufacture as recited in claim 1 wherein silver (Ag), titanium (Ti), or chromium (Cr) is used for the backside electrode.

4. A method of amorphous silicon solar cell manufacture as recited in claim 1 wherein an aqueous solution of a fluoride compound is used to treat the amorphous silicon layer surface after wet-etching the backside electrode and prior to wet-etching the amorphous silicon layer.

5. A method of amorphous silicon solar cell manufacture comprising forming thin layers of:
   (a) transparent electrode;
   (b) amorphous silicon; and
   (c) backside electrode;
   in that order, on a transparent substrate; and characterized in that:
   (d) an alkali resistant metal is used for said backside electrode;
   (e) said backside electrode is wet-etched using a first etchant and said amorphous silicon layer is wet-etched with a second alkaline etchant solution, thereby opening holes or grooves that penetrate through these layers; and further characterized in that:
   (f) a metallic thin film attachment layer is formed between said backside electrode and said amorphous silicon layer;
   (g) said backside electrode is attached to said amorphous silicon layer via said metallic thin film attachment layer; and
   (h) in step (e) said backside electrode and said metallic thin film attachment layer are wet-etched using said first etchant, and said amorphous silicon layer is wet-etched with said second alkaline etchant solution, thereby opening said holes or grooves that penetrate through these layers.

6. A method of amorphous silicon solar cell manufacture as recited in claim 5 wherein tungsten (W) is used for the metallic thin film attachment layer.

7. A method of amorphous silicon solar cell manufacture as recited in claim 5 wherein titanium (Ti) is used for the metallic thin film attachment layer.

8. A method of amorphous silicon solar cell manufacture as recited in claim 5 wherein chromium (Cr) is used for the metallic thin film attachment layer.

9. A method of amorphous silicon solar cell manufacture as recited in claim 5 wherein Cu is used for the backside electrode.

10. A method of amorphous silicon solar cell manufacture as recited in claim 9 wherein the surface of the Cu backside electrode is coated with Ti.

11. A method of amorphous silicon solar cell manufacture as recited in claim 9 wherein the surface of the Cu backside electrode is coated with Ni.

12. A method of amorphous silicon solar cell manufacture as recited in claim 9 wherein the surface of the Cu backside electrode is coated with NiCu.

13. A method of amorphous silicon solar cell manufacture as recited in claim 5 wherein an aqueous solution of a fluoride compound is used to treat the amorphous silicon layer surface, after wet-etching the backside electrode and metallic thin film attachment layer, and prior to wet-etching the amorphous silicon layer.

14. A method of amorphous silicon solar cell manufacture as recited in claim 5 wherein Ag is used for the backside electrode.

15. An amorphous silicon solar cell comprising thin layers of:
   (a) transparent electrode;
   (b) amorphous silicon; and
   (c) backside electrode comprising an alkali resistant metal; formed in that order on a transparent substrate; wherein holes or grooves are provided through said backside electrode and amorphous silicon layer by wet-etching, and further characterized in that;
   (d) a metallic thin film attachment layer is sandwiched between said backside electrode and the amorphous silicon layer;
   (e) said backside electrode adheres to said amorphous silicon layer via said metallic thin film attachment layer; and
   (f) holes or grooves are provided through said backside electrode and said thin film attachment layer by wetetching using a first etchant, and through the amorphous silicon layer by wet-etching using a second, alkaline etchant solution.

16. An amorphous silicon solar cell as recited in claim 15 wherein Cu is used for the backside electrode.

17. An amorphous silicon solar cell as recited in claim 15 wherein Ag is used for the backside electrode.

18. A method of amorphous silicon solar cell manufacture comprising forming thin layers of:
   (a) transparent electrode;
   (b) amorphous silicon; and
   (c) backside electrode;
   in that order, on a transparent substrate; and characterized in that:
   (d) an alkali resistant metal is used for said backside electrode; and
   (e) said backside electrode and said amorphous silicon layer are wet-etched according to the following sequence:
      (i) said backside electrode is wet-etched using a first etchant;
      (ii) said amorphous silicon layer is treated with an aqueous solution of a fluoride compound; and (iii) said amorphous silicon layer is wet-etched with a second alkaline etchant solution;

thereby opening holes or grooves that penetrate through these layers.

19. A method of amorphous silicon solar cell manufacture comprising forming thin layers of:
(a) transparent electrode;
(b) amorphous silicon; and
(c) backside electrode;

in that order, on a transparent substrate; and characterized in that:
(d) an alkali resistant metal is used for said backside electrode;
(e) said backside electrode is wet-etched using a first etchant and said amorphous silicon layer is wet-etched with a second alkaline etchant solution, thereby opening holes or grooves that penetrate through these layers; and further characterized in that:

(f) a metallic thin film attachment layer is formed between said backside electrode and said amorphous silicon layer;
(g) said backside electrode is attached to said amorphous silicon layer via said metallic thin film attachment layer; and subsequently
(h) in step (e) said backside electrode, said metallic thin film attachment layer, and said amorphous silicon layer are wet-etched according to the following sequence:
  (i) said backside electrode and said metallic thin film attachment layer are wet-etched using said first etchant;
  (ii) said amorphous silicon layer is treated with an aqueous solution of a fluoride compound; and
  (iii) said amorphous silicon layer is wet-etched with said second alkaline etchant solution;

thereby opening holes or grooves that penetrate through these layers.

* * * * *